United States Patent
Ishii et al.

(10) Patent No.: US 12,176,737 B2
(45) Date of Patent: Dec. 24, 2024

(54) MANAGEMENT DEVICE, POWER SUPPLY SYSTEM, ELECTRICALLY DRIVEN MOVING BODY, AND MANAGEMENT METHOD

(71) Applicant: Panasonic Intellectual Property Management Co., Ltd., Osaka (JP)

(72) Inventors: Yohei Ishii, Osaka (JP); Yusuke Itakura, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 12 days.

(21) Appl. No.: 18/006,570

(22) PCT Filed: Jul. 19, 2021

(86) PCT No.: PCT/JP2021/026951
§ 371 (c)(1),
(2) Date: Jan. 23, 2023

(87) PCT Pub. No.: WO2022/024836
PCT Pub. Date: Feb. 3, 2022

(65) Prior Publication Data
US 2023/0307925 A1  Sep. 28, 2023

(30) Foreign Application Priority Data
Jul. 28, 2020 (JP) .................................. 2020-127118

(51) Int. Cl.
*H02J 7/00* (2006.01)
*B60L 50/60* (2019.01)
(Continued)

(52) U.S. Cl.
CPC ............. *H02J 7/0013* (2013.01); *B60L 50/60* (2019.02); *B60L 58/12* (2019.02); *B60L 58/22* (2019.02);
(Continued)

(58) Field of Classification Search
CPC .......... B60L 50/60; B60L 53/80; B60L 58/10; B60L 58/12; B60L 58/13; B60L 58/18;
(Continued)

(56) References Cited

U.S. PATENT DOCUMENTS

2011/0257915 A1  10/2011  Yamamoto et al.
2012/0065827 A1*  3/2012  Kimura ................... B60L 58/18
903/903
(Continued)

FOREIGN PATENT DOCUMENTS

| CN | 107769279 A | 3/2018 |
|---|---|---|
| EP | 3379682 A1 | 9/2018 |
| JP | 2011-226805 | 11/2011 |

OTHER PUBLICATIONS

International Search Report of PCT application No. PCT/JP2021/026951 dated Oct. 5, 2021.
(Continued)

*Primary Examiner* — Levi Gannon
(74) *Attorney, Agent, or Firm* — Rimon P.C.

(57) ABSTRACT

An acquisition unit of management unit acquires monitoring data including at least one of voltage and state of charge of a plurality of power storage packs connected in parallel. A switch controller can individually control on/off of a plurality of switches based on a voltage difference between the plurality of power storage packs or an SOC difference between the plurality of power storage packs. When calculating the entire capacity of the plurality of power storage packs, a capacity calculator also adds the capacity of power
(Continued)

storage pack connected to a switch in an off state in a case where the switch can be controlled to an on state in future.

9 Claims, 8 Drawing Sheets

(51) Int. Cl.
    *B60L 58/12*     (2019.01)
    *B60L 58/22*     (2019.01)
    *G01R 31/36*     (2020.01)
    *G01R 31/387*     (2019.01)
    *B60L 53/80*     (2019.01)

(52) U.S. Cl.
    CPC .......... *G01R 31/387* (2019.01); *H02J 7/0048* (2020.01); *B60L 53/80* (2019.02); *B60L 2240/547* (2013.01)

(58) Field of Classification Search
    CPC .......... B60L 58/20; B60L 58/21; B60L 58/22; B60L 2240/547; G01R 31/387; H02J 7/0013; H02J 7/0048; H02J 7/0049; H02J 7/005

See application file for complete search history.

(56) References Cited

U.S. PATENT DOCUMENTS

| | | | | |
|---|---|---|---|---|
| 2015/0364797 | A1* | 12/2015 | Inaba | H01M 10/0525 |
| | | | | 429/61 |
| 2018/0248388 | A1* | 8/2018 | Takatsuka | B60L 58/14 |
| 2019/0097437 | A1* | 3/2019 | Cho | A61H 1/0266 |
| 2019/0123567 | A1* | 4/2019 | Kaneko | B60L 50/60 |
| 2019/0123568 | A1* | 4/2019 | Kaneko | H02J 7/0013 |

OTHER PUBLICATIONS

The EPC Office Action dated Feb. 21, 2024 for the related European Patent Application No. 21848778.3.

* cited by examiner

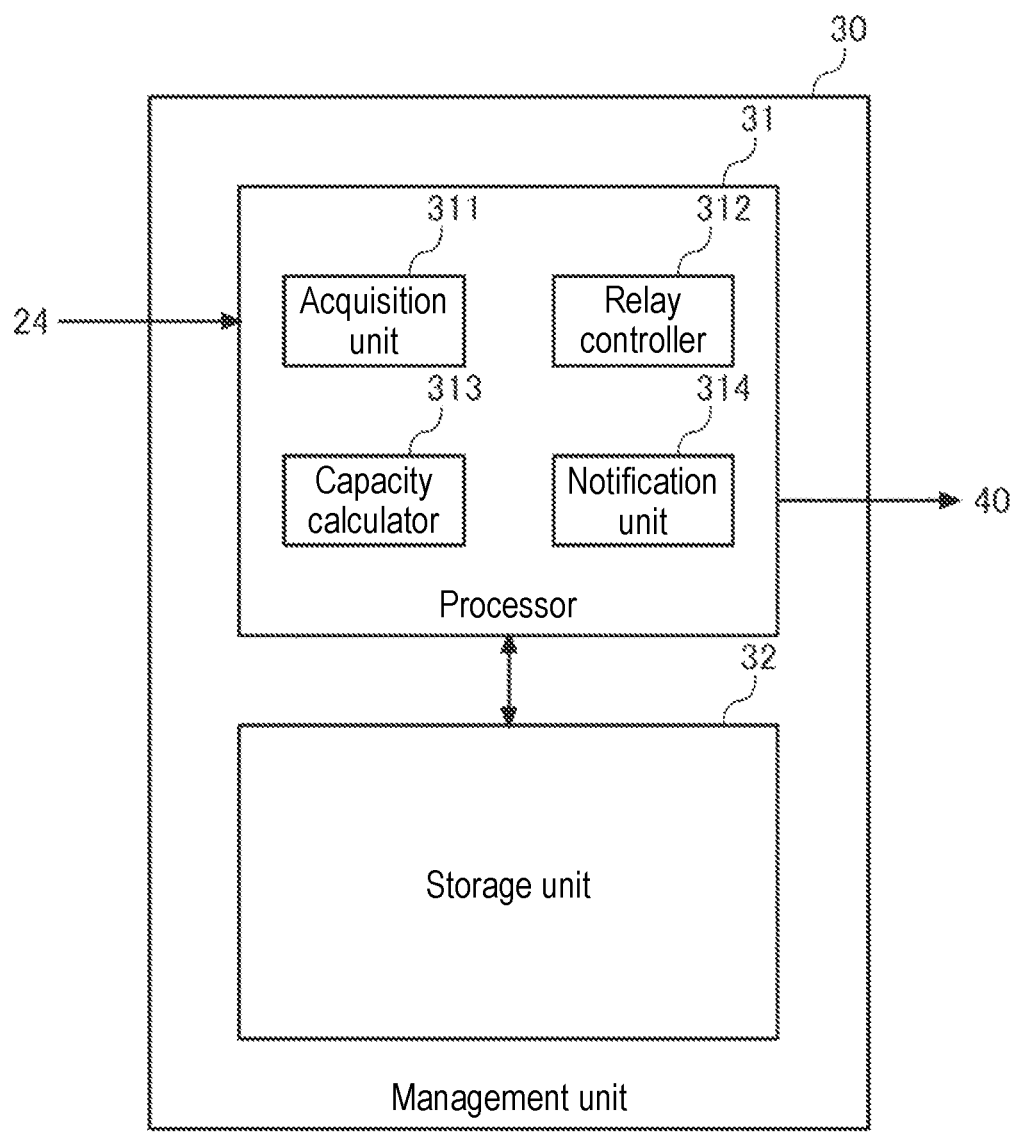

MANAGEMENT DEVICE, POWER SUPPLY SYSTEM, ELECTRICALLY DRIVEN MOVING BODY, AND MANAGEMENT METHOD

TECHNICAL FIELD

The present disclosure relates to a management device that manages a plurality of power storage packs connected in parallel, a power supply system, an electrically driven moving body, and a management method of a power storage pack.

BACKGROUND ART

In a moving body (for example, EV or electric ship) using electricity as a source of power, it is conceivable to increase a capacity by connecting a plurality of battery packs in parallel, and to prolong a use time of a power source. In a configuration in which a plurality of battery packs are connected in parallel to a common power line, when there is an open circuit voltage (OCV) difference between the battery packs, an inrush current flows from a battery pack having a high OCV to a battery pack having a low OCV through the power line when a relay is turned on. Therefore, when there is an OCV difference between the plurality of battery packs, it is conceivable not to turn on all the relays at the start of use but to sequentially turn on the relays according to reduction of the OCV difference accompanying the use of the battery packs.

Conventionally, a fresh battery has been often fixedly mounted on an electrically driven moving body at the time of manufacturing, and a situation in which a plurality of batteries having non-uniform state of charge (SOC) or state of health (SOH) are connected in parallel has been less likely to occur. On the other hand, in recent years, a use form has been proposed in which a portable battery pack is shared and used among a plurality of electrically driven moving bodies. In this case, a situation in which a plurality of battery packs having non-uniform SOC or SOH is connected in parallel is likely to occur.

PTL 1 discloses a method of calculating the entire remaining capacity of two power storage devices connected in parallel in consideration of a difference between the remaining capacity of the two power storage devices. PTL 1 does not consider the remaining capacity of a power storage device that is not connected to a power line.

CITATION LIST

Patent Literature

PTL 1: Unexamined Japanese Patent Publication No. 2011-226805

SUMMARY OF THE INVENTION

As described above, in the configuration in which the plurality of battery packs are connected in parallel to a power line, a situation in which a battery pack connected to the power line and a battery pack not connected to the power line are mixed can occur. For example, when there is an OCV difference between battery packs, a battery pack with a low voltage is sometimes not connected to a power line in order to avoid cross current. The battery pack in which an abnormality occurs is sometimes not connected to the power line. In the former case, the battery pack is connected to the power line when the OCV difference is reduced, but in the latter case, in principle, the battery pack is not connected to the power line unless the abnormality is eliminated.

The user has a need to accurately grasp the capacity of the entire battery pack connected in parallel in order to grasp the travelable distance and the travelable time of an electrically driven moving body.

The present disclosure has been made in view of such a situation, and an object of the present disclosure is to provide a technique for appropriately notifying the entire capacity of a plurality of power storage packs connected in parallel.

In order to solve the above problem, a management device of an aspect of the present disclosure is a management device that manages a plurality of power storage packs connected in parallel to a load via respective switches, the management device including: an acquisition unit that acquires monitoring data including at least one of voltage and SOC of the plurality of power storage packs; a switch controller capable of individually controlling on/off of the plurality of switches based on a voltage difference between the plurality of power storage packs or an SOC difference between the plurality of power storage packs; and a capacity calculator that calculates an entire capacity of the plurality of power storage packs. When calculating the entire capacity of the plurality of power storage packs, the capacity calculator also adds a capacity of a power storage pack connected to a switch in an off state in a case where the switch can be controlled to an on state in future.

Any combinations of the configuration elements described above and expressions of the present disclosure that are converted in terms of methods, devices, systems, computer programs, and the like are also effective as aspects of the present disclosure.

According to the present disclosure, it is possible to appropriately notifying the entire capacity of a plurality of power storage packs connected in parallel.

BRIEF DESCRIPTION OF THE DRAWINGS

FIG. 3 is a view illustrating an internal configuration example of the management unit of FIG. 1.

DESCRIPTION OF EMBODIMENT

Figure 1:
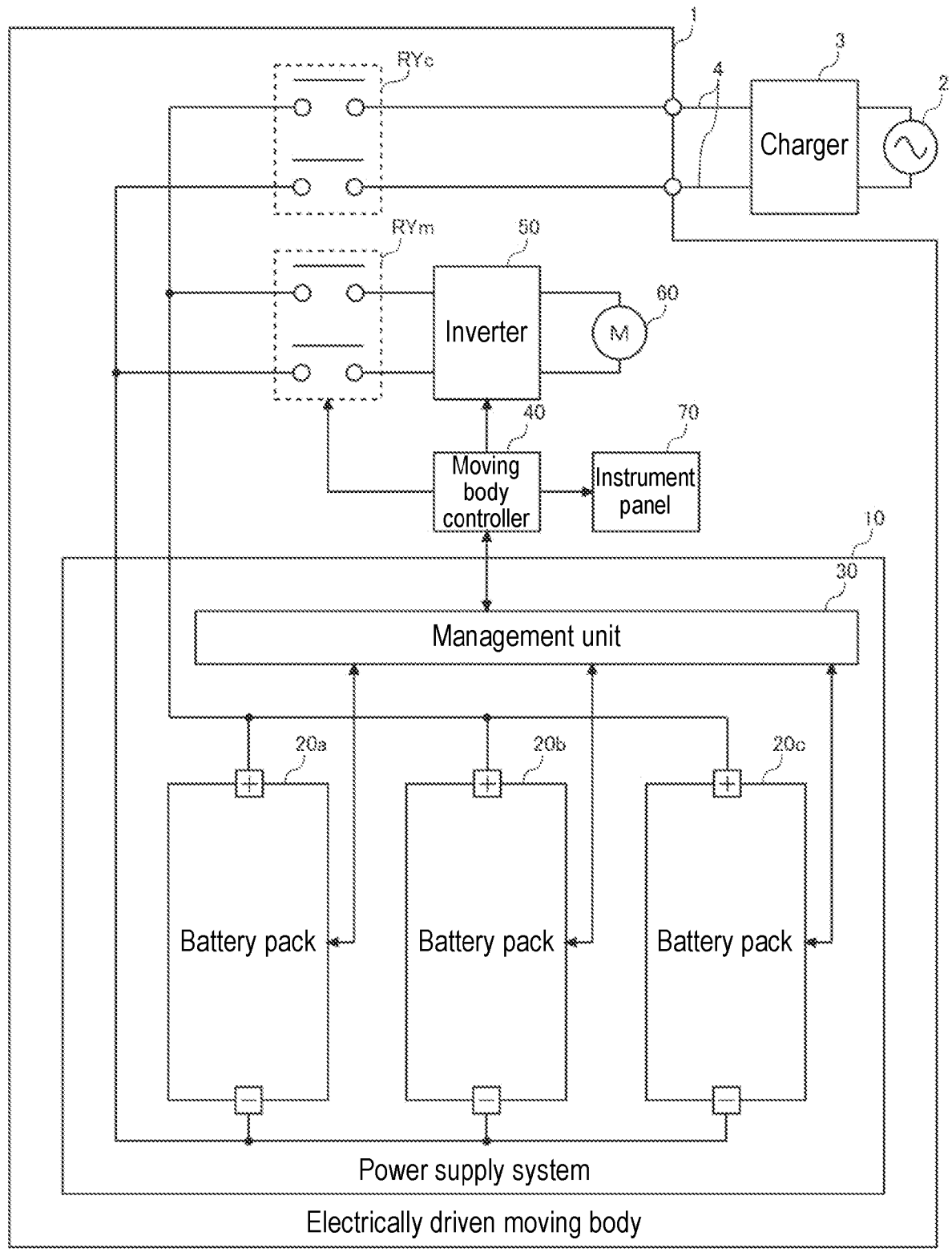
FIG. 1 is a view for describing an electrically driven moving body on which a power supply system according to an exemplary embodiment is mounted.

FIG. 1 is a view for describing electrically driven moving body 1 on which power supply system 10 according to an exemplary embodiment is mounted. Electrically driven moving body 1 is a moving body using a removable, portable, and replaceable battery pack 20 as a power source. Electrically driven moving body 1 includes electric vehicles such as an EV, a PHEV, and a HV. The electric vehicle may be a general passenger car or a commercial vehicle, or may be a low-speed electric vehicle whose maximum speed is limited to about 20 km/h. The low-speed electric vehicles include a golf cart and a land car. The electric vehicles also include a construction machine vehicle. The electric vehicles also include a two-wheeled electric motorcycle (electric scooter) and an electric bicycle.

Electrically driven moving body 1 also includes a railway vehicle that can be substituted for a diesel train mainly used in a non-electrified route. Electrically driven moving body 1 also includes an electric ship. Electrically driven moving body 1 also includes a multi-copter (drone).

Power supply system 10 is connected to motor 60 via main relay RYm and inverter 50. Inverter 50 converts DC power supplied from power supply system 10 into AC power and supplies the AC power to motor 60. When electrically driven moving body 1 is an electric vehicle, motor 60 rotates wheels. When electrically driven moving body 1 is an electric ship, motor 60 rotates a screw. When electrically driven moving body 1 is a multi-copter, motor 60 rotates a propeller.

Moving body controller 40 is a control device that controls entire electrically driven moving body 1. Main relay RYm is a contactor inserted between wirings connecting power supply system 10 and inverter 50. When electrically driven moving body 1 moves, moving body controller 40 controls main relay RYm to be in an on state (closed state), and electrically connects power supply system 10 and the power system of electrically driven moving body 1. When electrically driven moving body 1 is stopped, moving body controller 40 controls main relay RYm to be in an off state (open state), and electrically interrupts power supply system 10 and the power system of electrically driven moving body 1.

Power supply system 10 includes a plurality of battery packs 20a to 20c and management unit 30. The plurality of battery packs 20a to 20c are connected in parallel to a load (mainly, motor 60) of electrically driven moving body 1. The number of battery packs 20 in parallel is determined according to a required capacity or a required output of electrically driven moving body 1.

Instrument panel 70 is a user interface for notifying the driver or the operator of a state index (speed, rotation speed, remaining battery level, and the like) of electrically driven moving body 1. Instrument panel 70 may indicate various state indices of electrically driven moving body 1 by movement of a needle, or may cause a liquid crystal display or an organic EL display to display the state indices.

Use of removable portable battery pack 20 as a source of power makes it possible to shorten the time required for energy supply (specifically, charging or oil supply) by replacing, at a charging stand, battery pack 20 charged in advance with battery pack 20 having a reduced remaining capacity. However, in a case where there is no charging stand at which battery pack 20 can be replaced, similarly to fixed battery pack 20, it is convenient that battery pack 20 can be charged from the outside while being mounted on electrically driven moving body 1.

Electrically driven moving body 1 illustrated in FIG. 1 has an external charging function. By connecting, using charging cable 4, electrically driven moving body 1 and external charger 3 connected to commercial power system 2, it is possible to charge power supply system 10 from commercial power system 2. In electrically driven moving body 1, charging relay RYc is inserted between wirings connecting power supply system 10 and charger 3. Management unit 30 of power supply system 10 controls charging relay RYc to be in the on state before start of charging, and controls charging relay RYc to be in the off state after end of charging.

In general, AC is used for normal charging, and DC is used for quick charging. In the case of charging with AC, AC power is converted into DC power by an AC/DC converter (not illustrated) inserted between charging relay RYc and power supply system 10. Charging is also possible by directly inserting a plug of charging cable 4 into a general AC outlet installed in a building or the like.

The external charging function is not essential. In electrically driven moving body 1 not including an external charging function, charging relay RYc and a charging port for connecting charging cable 4 are omitted.

Figure 2:
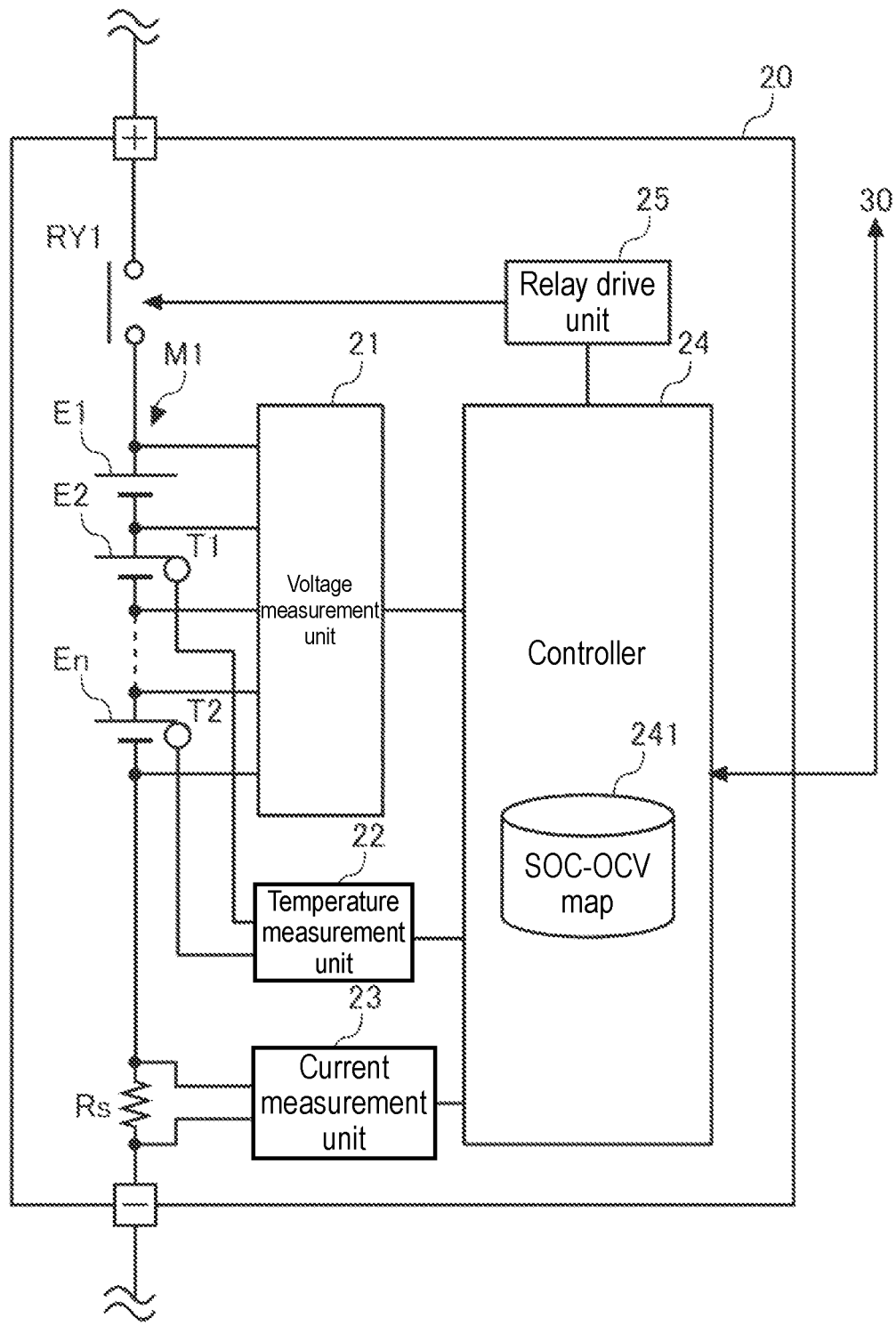
FIG. 2 is a view illustrating an internal configuration example of the battery pack of FIG. 1.

FIG. 2 is a view illustrating an internal configuration example of battery pack 20 of FIG. 1. Battery pack 20 includes pack relay RY1, relay drive unit 25, battery module M1, shunt resistor Rs, temperature sensors T1 and T2, voltage measurement unit 21, temperature measurement unit 22, current measurement unit 23, and controller 24. Relay drive unit 25 turns on or off pack relay RY1 in response to a control signal received from management unit 30 via controller 24.

Battery module M1 includes a plurality of cells E1 to En connected in series. Battery module M1 may be configured by connecting, in series, a plurality of cell blocks including a plurality of cells connected in parallel. As the cell, a lithium ion battery cell, a nickel metal hydride battery cell, a lead battery cell, or the like can be used. Hereinafter, the present description assumes an example of use of lithium ion battery cells (nominal voltage: 3.6 V to 3.7 V).

Shunt resistor Rs is connected in series with the plurality of cells E1 to En configuring battery module M1. Shunt resistor Rs functions as a current detection element. A Hall element may be used in place of shunt resistor Rs. The plurality of temperature sensors T1 and T2 for detecting temperatures of the plurality of cells E1 to En is disposed. One temperature sensor may be disposed in battery module M1, or a plurality of temperature sensors may be disposed in battery module M1. For example, a thermistor can be used for temperature sensors T1 and T2.

A plurality of voltage lines are connected between nodes of the plurality of cells E1 to En connected in series and voltage measurement unit 21. Voltage measurement unit 21 measures voltage of each of cells E1 to En by measuring a voltage between each two adjacent voltage lines. Voltage measurement unit 21 transmits the measured voltages of cells E1 to En to controller 24 via a communication line.

Since voltage measurement unit 21 has a higher voltage with respect to controller 24, voltage measurement unit 21 and controller 24 are connected by the communication line in a state where they are insulated as necessary. Voltage measurement unit 21 can be configured using an application specific integrated circuit (ASIC) or a general-purpose analog front-end IC. Voltage measurement unit 21 includes a multiplexer and an A/D converter. The multiplexer outputs the voltage between two adjacent voltage lines to the A/D converter in order from the top. The A/D converter converts, into a digital value, an analog voltage to be input from the multiplexer.

Temperature measurement unit 22 includes a voltage dividing resistor and an A/D converter. The A/D converter sequentially converts, into digital values, a plurality of analog voltages divided by the plurality of temperature sensors T1 and T2 and a plurality of the voltage dividing resistors, and outputs the digital values to controller 24. Controller 24 estimates the temperatures of the plurality of cells E1 to En based on the digital values.

Current measurement unit 23 includes a differential amplifier and an A/D converter. The differential amplifier amplifies the voltage between both ends of shunt resistor Rs and outputs the amplified voltage to the A/D converter. The A/D converter converts, into a digital value, the analog voltage input from the differential amplifier, and outputs the digital value to controller 24. Controller 24 estimates a current flowing through the plurality of cells E1 to En based on the digital value.

When the A/D converter is mounted in controller 24 and an analog input port is installed in controller 24, temperature measurement unit 22 and current measurement unit 23 may output an analog voltage to controller 24, and the A/D converter in controller 24 may convert the analog voltage into a digital value.

Controller 24 manages the states of the plurality of cells E1 to En based on the voltages, the temperatures, and the currents of the plurality of cells E1 to En measured by voltage measurement unit 21, temperature measurement unit 22, and current measurement unit 23. Controller 24 can be configured by a microcomputer and a nonvolatile memory (for example, an electrically erasable programmable read-only memory (EEPROM) or a flash memory).

SOC-OCV map 241 is held in the microcomputer or the nonvolatile memory. SOC-OCV map 241 describes characteristic data of SOC-OCV curves of cells E1 to En. The SOC-OCV curves of cells E1 to En are created in advance based on characteristic tests by a battery manufacturer, and are registered in the microcomputer or the nonvolatile memory at the time of shipment. SOC-OCV characteristics of cells E1 to En may depend on temperature and SOH. In that case, the battery manufacturer derives and maps the SOC-OCV characteristics of cells E1 to En for each combination of the temperature division and the SOH division. Instead of the map, a function having the SOC as an objective variable and the OCV, the temperature, and the SOH as explanatory variables may be used.

Controller 24 estimates the SOC, a full charge capacity (FCC), and the SOH of each of the plurality of cells E1 to En. Controller 24 estimates the SOC by the OCV method, the current integration method, or a combination of the both. The OCV method is a method of estimating the SOC based on the OCV of each of cells E1 to En measured by voltage measurement unit 21 and the characteristic data of the SOC-OCV curve described in SOC-OCV map 241. The current integration method is a method of estimating the SOC based on the OCV at the start of charging and discharging of each of cells E1 to En and the integrated value of the current measured by current measurement unit 23. In the current integration method, a measurement error of current measurement unit 23 accumulates as the charging and discharging time becomes longer. Thus, the SOC estimated with the current integration method is preferably corrected using the SOC estimated with the OCV method.

Based on characteristic data of the SOC-OCV curve described in SOC-OCV map 241 and two OCVs of cells measured by voltage measurement unit 21, controller 24 can estimate the FCC of the cell.

Based on time transition of the current measured by current measurement unit 23, controller 24 calculates current integration amount (=charge and discharge capacity) Q in a period between the times of the two points at which the two OCVs are acquired. Controller 24 can estimate the FCC by calculating the following (Equation 1).

$$FCC = Q/\Delta SOC \quad \text{(Equation 1)}$$

The SOH is defined as a ratio of the present FCC to the initial FCC, and the lower the value of SOH (closer to 0%) is, the more the degradation has progressed. Controller 24 can estimate the SOH by calculating the following (Equation 2).

$$SOH = \text{Current FCC/Initial FCC} \quad \text{(Equation 2)}$$

The SOH may be obtained by capacity measurement by complete charge and discharge, or may be obtained by adding storage degradation and cycle degradation. The storage degradation can be estimated based on the SOC, the temperature, and a storage degradation rate. The cycle degradation can be estimated based on a SOC range to be used, the temperature, a current rate, and the cycle degradation rate. The storage degradation rate and the cycle degradation rate can be derived in advance by experiments or simulations. The SOC, the temperature, the SOC range, and the current rate can be obtained by measurement.

The SOH can also be estimated based on a correlation with an internal resistance of the cell. The internal resistance can be estimated by dividing, by the current value, a voltage drop occurring when a predetermined current flows through a cell for a predetermined time. The internal resistance decreases as the temperature rises, and increases as the SOH decreases.

Controller 24 transmits monitoring data including the voltages, the temperatures, the currents, and the SOCs of the plurality of cells E1 to En included in battery pack 20 to management unit 30 at a predetermined frequency. In addition to these data items, controller 24 may include at least one of the voltage, the actual capacity, and the SOC of the entire battery pack 20 into the monitoring data and transmit the monitoring data. Controller 24 transmits state data including at least one of the FCCs, the SOHs, and the internal resistances of the plurality of cells E1 to En included in battery pack 20 to management unit 30 at a frequency lower than that of the monitoring data. For communication between controller 24 of battery pack 20 and management unit 30, it is possible to use serial communication conforming to RS-485 specifications, for example. Controller 24 of battery pack 20 and management unit 30 may be connected to each other through a dedicated communication line, wireless communication, or power line communication.

FIG. 3 is a view illustrating an internal configuration example of management unit 30 of FIG. 1. Management unit 30 includes processor 31 and storage unit 32, and manages the plurality of battery packs 20a to 20c. Processor 31 includes acquisition unit 311, relay controller 312, capacity calculator 313, and notification unit 314. The function of processor 31 can be achieved by cooperation of a hardware resource and a software resource, or by the hardware resource alone. A CPU, a ROM, a RAM, a DSP, an ASIC, a FPGA, and other LSIs can be used as a hardware resource. As a software resource, a program such as firmware can be used. Storage unit 32 includes a nonvolatile recording medium such as a flash memory, and records various programs and data.

Acquisition unit 311 acquires monitoring data including at least one of the voltages and the SOCs of the plurality of battery packs 20a to 20c. Relay controller 312 generates a control signal for individually controlling on/off of the plurality of pack relays RY1a to RY1c based on a voltage difference or an SOC difference between the plurality of battery packs 20a to 20c, and transmits the control signal to controllers 24a to 24c of the plurality of battery packs 20a to 20c.

Capacity calculator 313 calculates the entire capacity (hereinafter, referred to as system capacity) of the plurality of battery packs 20a to 20c based on each actual capacity or each SOC of the plurality of battery packs 20a to 20c. When calculating the system capacity, capacity calculator 313 also adds, to the system capacity, the capacity of the battery pack connected to pack relay RY1 in an off state in a case where pack relay RY1 can be controlled to be in an on state in future.

When calculating the system capacity with the SOC, capacity calculator 313 calculates, as the system capacity, an SOC obtained by dividing, by the total of respective actual capacities, a total of products of respective actual capacities and respective SOCs of battery pack 20 connected to pack relay RY1 in an on state and battery pack 20 connected to pack relay RY1 that can be controlled to an on state in future.

When calculating the system capacity with the SOC, capacity calculator 313 calculates, as the system capacity, an SOC obtained by dividing, by the total of respective SOCs, a total of products of respective actual capacities and respective SOCs of battery pack 20 connected to pack relay RY1 in an on state and battery pack 20 connected to pack relay RY1 that can be controlled to an on state in future.

It is considered that the capacity of battery pack 20 in which the abnormality has occurred is excluded when the system capacity is calculated. When it is estimated that overvoltage, undervoltage, overcurrent, temperature abnormality, short circuit, disconnection, or the like has occurred in any of cells E1 to En in battery pack 20 based on the monitoring data acquired from battery pack 20, it is determined that an abnormality has occurred in battery pack 20.

Notification unit 314 notifies moving body controller 40 of the system capacity calculated by capacity calculator 313. Management unit 30 and moving body controller 40 are connected via a network such as a controller area network (CAN), for example. Moving body controller 40 causes instrument panel 70 to present the received system capacity and notifies the driver or the operator of the system capacity. Moving body controller 40 may notify the driver or the operator of the system capacity by voice through voice synthesis.

Figure 4A:
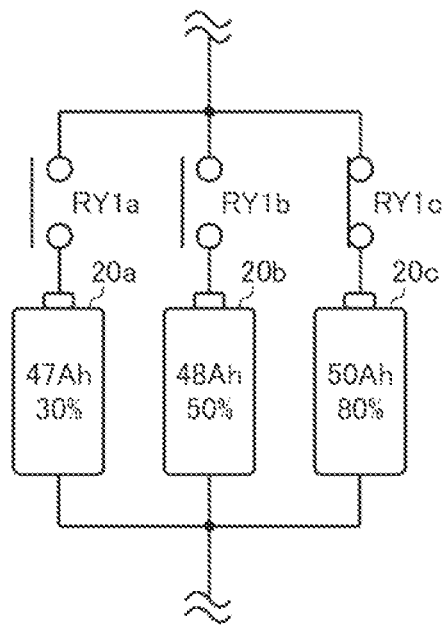
FIG. 4A is a view for describing a first calculation example of a system capacity.
Figure 4B:
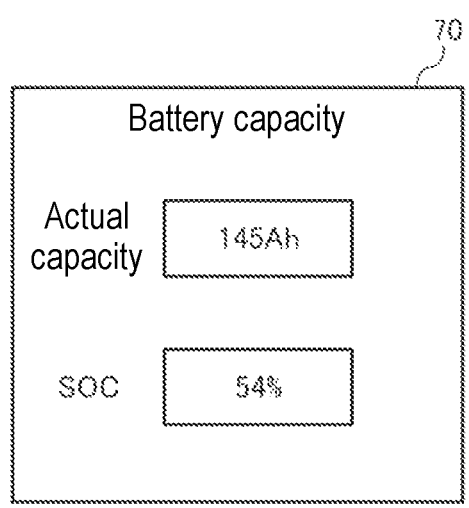
FIG. 4B is a view for describing the first calculation example of the system capacity.

FIGS. 4A and 4B are views for describing the first calculation example of the system capacity. The example illustrated in FIG. 4A is an example in which first battery pack 20a having an actual capacity of 47 [Ah] and an SOC of 30 [%], second battery pack 20b having an actual capacity of 48 [Ah] and an SOC of 50 [%], and third battery pack 20c having an actual capacity of 50 [Ah] and an SOC of 80 [%] are connected in parallel. In the case of replaceable battery pack 20, a state in which a plurality of battery packs 20 having greatly different SOHs are connected in parallel may occur. Therefore, even when the actual capacities of the plurality of battery packs 20 are close to each other, a state in which the SOCs greatly deviate may occur.

When the voltage or the SOC between the plurality of battery packs 20a to 20c is different, relay controller 312 basically turns on from pack relay RY1 connected to battery pack 20 having the highest voltage or SOC. When the voltage or the SOC of battery pack 20 having the highest voltage or SOC approaches the voltage or the SOC of battery pack 20 having the second highest voltage or SOC, relay controller 312 turns on pack relay RY1 connected to battery pack 20 having the second highest voltage or SOC. This process is repeated in a similar manner.

In FIG. 4A, pack relay RY1c connected to third battery pack 20c having the highest voltage or SOC is controlled to the on state, and pack relay RY1a connected to first battery pack 20a and pack relay RY1b connected to second battery pack 20b are controlled to the off state. The actual capacity actually conducted to the load in this state is only 50 [Ah] of third battery pack 20c.

However, as the capacity of third battery pack 20c is consumed by the load, a state in which the voltage or the SOC of second battery pack 20b and the voltage or the SOC of first battery pack 20a are matched occurs. That is, second battery pack 20b and first battery pack 20a can be deemed to be battery pack 20 connected to pack relay RY1 that is currently controlled to the off state but can be controlled to the on state in future. In the present exemplary embodiment, the capacity of battery pack 20 connected to pack relay RY1 that can be controlled to the on state in future is also added to the system capacity.

Since the system capacity defined by actual capacity is calculated by the sum of the actual capacities of connectable battery packs 20, the system capacity becomes 145 (=47+48+50) [Ah] in the example illustrated in FIG. 4A. Since the system capacity defined by SOC is calculated by a weighted sum of the SOCs of connectable battery packs 20, the system capacity becomes 54 (=(30*47+50*48+80*50)/145) [%] in the example illustrated in FIG. 4A.

FIG. 4B illustrates an example of instrument panel 70 displayed as a digital value. The driver or the operator can know the actually usable system capacity independent of the current connection state of the plurality of pack relays RY1.

Figure 5A:
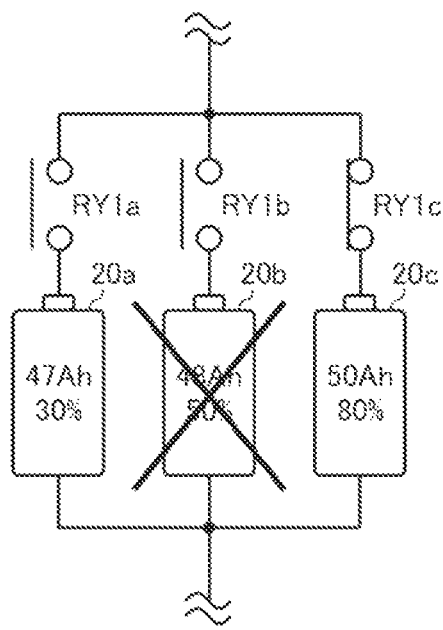
FIG. 5A is a view for describing a second calculation example of the system capacity.
Figure 5B:
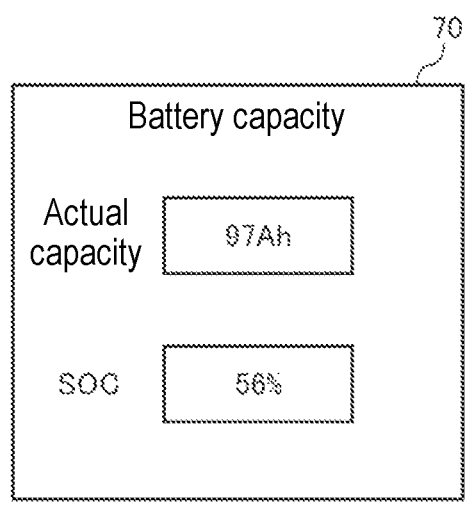
FIG. 5B is a view for describing the second calculation example of the system capacity.

FIGS. 5A and 5B are views for describing the second calculation example of the system capacity. The example illustrated in FIG. 5A is an example of a case where an abnormality occurs in second battery pack 20b from the state illustrated in FIG. 4A. In the present exemplary embodiment, the capacity of battery pack 20 in which the abnormality has occurred is not added when the system capacity is calculated.

Therefore, in the example illustrated in FIG. 5A, the system capacity defined by the actual capacity becomes 97 (=47+50) [Ah]. The system capacity defined by the SOC becomes 56 (=(30*47+80*50)/97) [%].

The state illustrated in FIG. 5A becomes lower in SOC than the state illustrated in FIG. 4A, but the state illustrated in FIG. 5A becomes faster in decrease rate of the SOC. As illustrated in FIGS. 4B and 5B, if the system capacity is notified with both the actual capacity and the SOC, the driver or the operator can quantitatively and proportionally grasp the remaining battery level.

Figure 6:
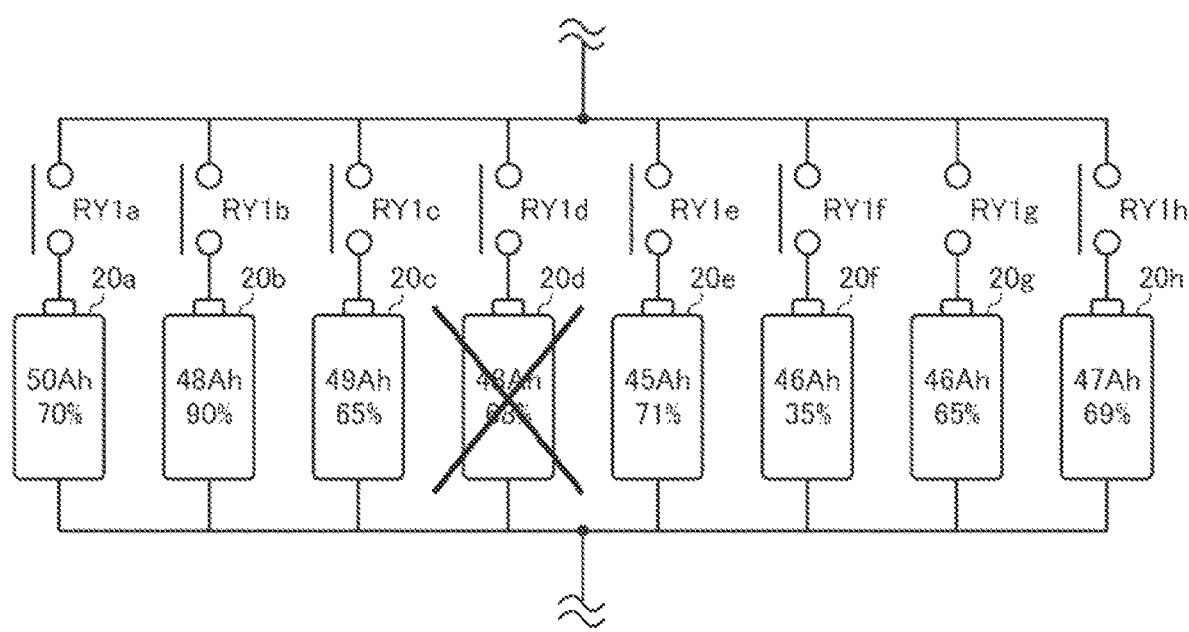
FIG. 6 is a view for describing a third calculation example of the system capacity.

FIG. 6 is a view for describing the third calculation example of the system capacity. FIG. 6 illustrates an example of parallel of eight battery packs. Specifically, it is an example in which first battery pack 20a having an actual capacity of 50 [Ah] and an SOC of 70 [%], second battery pack 20b having an actual capacity of 48 [Ah] and an SOC of 90 [%], third battery pack 20c having an actual capacity of 49 [Ah] and an SOC of 65 [%], fourth battery pack 20d having an actual capacity of 48 [Ah] and an SOC of 68 [%], fifth battery pack 20e having an actual capacity of 45 [Ah] and an SOC of 71 [%], sixth battery pack 20f having an actual capacity of 46 [Ah] and an SOC of 35 [%], fifth battery pack 20e having an actual capacity of 45 [Ah] and an SOC of 71 [%], sixth battery pack 20f having an actual capacity of 46 [Ah] and an SOC of 35 [%], seventh battery pack 20g having an actual capacity of 46 [Ah] and an SOC of 65 [%], and eighth battery pack 20*h* having an actual capacity of 47 [Ah] and an SOC of 69 [%] are connected in parallel.

In the example illustrated in FIG. 6, the minimum number of battery packs 20 in parallel for securing the power necessary for operating the load is set. Specifically, it is set that five or more battery packs in parallel are required. Control is performed such that the SOC difference between the plurality of battery packs 20 simultaneously connected in parallel falls within a predetermined range (within 15% in the example illustrated in FIG. 6). As described above, battery pack 20 in which an abnormality has occurred (fourth battery pack 20*d* in the example illustrated in FIG. 6) is excluded from the connection candidate. Relay controller 312 controls on/off of the plurality of pack relays RY1*a* to RY1*h* so as to satisfy these conditions.

Figure 7:
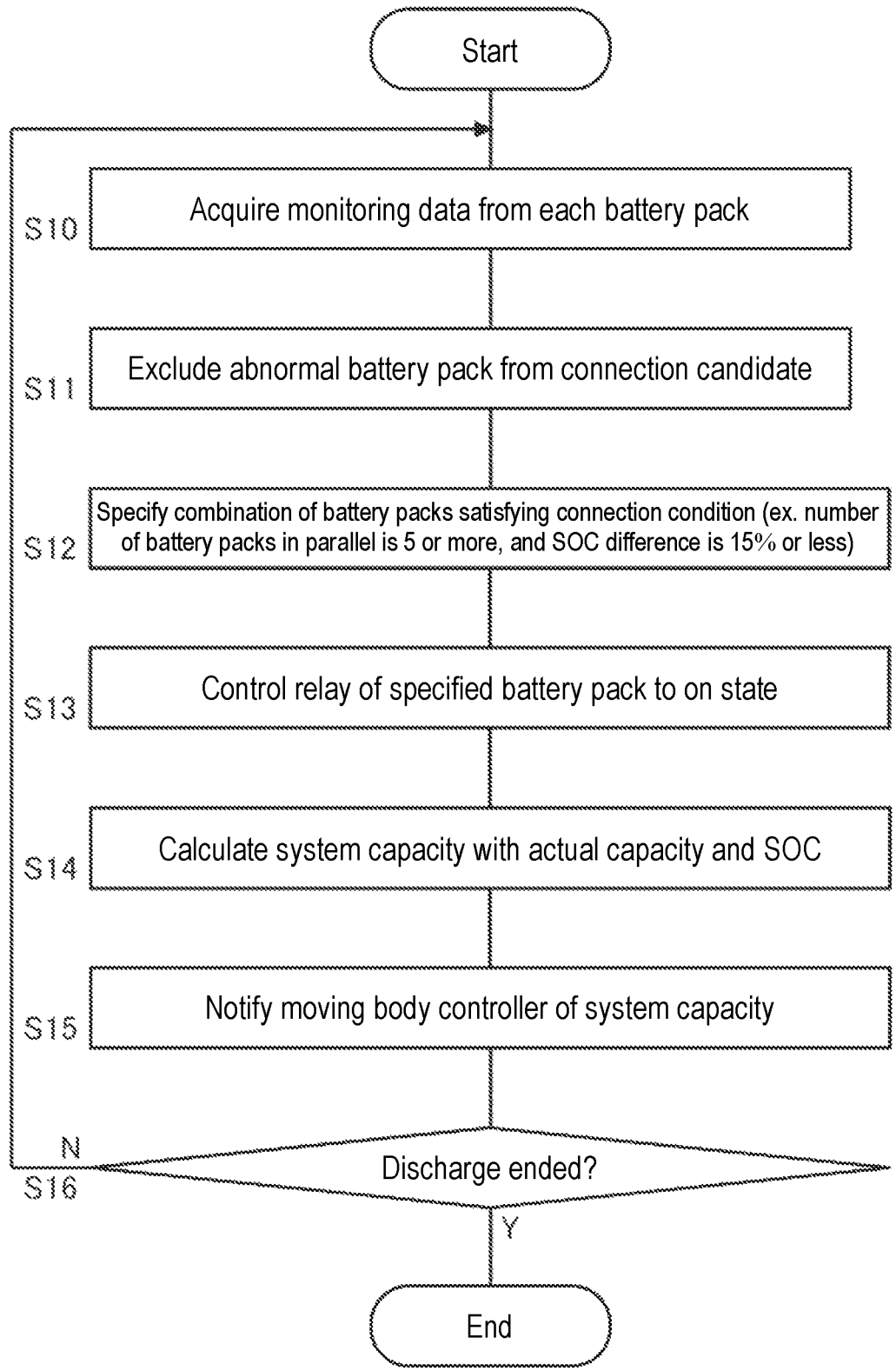
FIG. 7 is a flowchart for describing the third calculation example of the system capacity.

FIG. 7 is a flowchart for describing the third calculation example of the system capacity. When discharge from power supply system 10 to motor 60 is started, acquisition unit 311 acquires monitoring data from the plurality of battery packs 20*a* to 20*h* (S10). Relay controller 312 excludes, from the connection candidate, battery pack 20 in which the abnormality has occurred (fourth battery pack 20*d* in the example illustrated in FIG. 6) (S11). Relay controller 312 specifies a combination of battery packs 20 that satisfies the connection conditions (S12).

Specifically, relay controller 312 extracts five battery packs 20 in descending order of SOC among battery packs 20 of the connection candidate. Relay controller 312 determines whether or not the SOC difference among extracted five battery packs 20 falls within 15%. When the SOC difference among five battery packs 20 does not fall within 15%, battery pack 20 having the highest SOC is excluded from the connection candidate.

Relay controller 312 extracts five battery packs 20 in descending order of SOC among battery packs 20 of the new connection candidate. Relay controller 312 determines whether or not the SOC difference among extracted five battery packs 20 falls within 15%. Relay controller 312 repeatedly executes this processing until five battery packs 20 satisfying the condition can be specified.

Relay controller 312 determines whether or not the SOC difference among six battery packs 20 in which battery pack 20 second in the order of SOC is added, in addition to specified five battery packs 20, falls within 15%. When the SOC difference falls within the range, relay controller 312 determines whether or not the SOC difference among seven battery packs 20 in which battery pack 20 third in the order of SOC, in addition to specified six battery packs 20, falls within 15%. In this manner, the maximum number of battery packs 20 in parallel in which the SOC difference falls within 15% is specified.

In the example illustrated in FIG. 6, relay controller 312 initially specifies first battery pack 20*a*, third battery pack 20*c*, fifth battery pack 20*e*, seventh battery pack 20*g*, and eighth battery pack 20*h*. Since the SOC of second battery pack 20*b* is too high, the second battery pack is excluded from the connection candidate.

Relay controller 312 controls pack relays RY1 of the plurality of specified battery packs 20 to be in the on state (S13). Capacity calculator 313 calculates the system capacity with the actual capacity and the SOC (S14). In the example illustrated in FIG. 6, capacity calculator 313 calculates, with the actual capacity and the SOC, the system capacities of the six battery packs excluding second battery pack 20*b* excluded from the connection candidate and fourth battery pack 20*d* in which an abnormality occurs. Notification unit 314 notifies moving body controller 40 of the calculated system capacity. Moving body controller 40 presents the received system capacity to instrument panel 70 (S15).

The processing from step S10 to step S15 described above is repeatedly executed (N in S16) until discharge ends (Y in S16). When the SOCs of first battery pack 20*a*, third battery pack 20*c*, fifth battery pack 20*e*, seventh battery pack 20*g*, and eighth battery pack 20*h* decrease due to power consumption of motor 60, and the SOC difference among the six battery packs in which sixth battery pack 20*f* is added to first battery pack 20*a*, third battery pack 20*c*, fifth battery pack 20*e*, seventh battery pack 20*g*, and eighth battery pack 20*h* falls within 15%, relay controller 312 controls sixth pack relay RY1*f* to be in the on state.

In the example illustrated in FIG. 7, relay controller 312 determines whether or not each battery pack 20 is connectable battery pack 20 based on the SOC difference between the plurality of battery packs 20. In this regard, relay controller 312 may determine whether or not each battery pack 20 is connectable battery pack 20 based on the voltage difference between the plurality of battery packs 20. Furthermore, relay controller 312 may determine whether or not each battery pack 20 is connectable battery pack 20 based on whether or not an inrush current is generated when pack relay RY1 is turned on based on the voltage difference and the internal resistance also in consideration of the internal resistance between the plurality of battery packs 20.

The flowchart illustrated in FIG. 7 presents control during discharging. Hereinafter, control during charging will be described. Relay controller 312 connects battery pack 20 having the lowest SOC at the initial stage, and gradually increases the number of battery packs 20 to be connected in parallel within the range in which the SOC difference is 15%. Similarly to the case of discharging, battery pack 20 in which an abnormality has occurred is excluded from the connection candidate.

Regardless of the connection state of each of the plurality of battery packs 20, capacity calculator 313 calculates the system capacity with the capacities of all battery packs 20 except for battery pack 20 in which the abnormality occurs are added. In the case of charging, capacity calculator 313 also calculates the time required for all battery packs 20 except battery pack 20 in which the abnormality occurs to reach the full charge. Moving body controller 40 presents, on instrument panel 70, the system capacities of all battery packs 20 except battery pack 20 in which the abnormality occurs and the time required for full charge.

As described above, according to the present exemplary embodiment, it is possible to appropriately calculate the system capacity of the plurality of replaceable battery packs 20 connected in parallel to be notified to the driver or the operator. That is, even battery pack 20 in which pack relay RY1 is in the off state, the system capacity is added from the start of use as long as battery pack 20 can be connected in the middle of use. This enables the driver or the operator to constantly grasp the remaining battery level that can be actually used regardless of the connection state of the plurality of battery packs 20.

Connection of new battery pack 20 makes it possible to prevent the capacity value presented on instrument panel 70 from changing suddenly and discontinuously. This makes it possible to prevent the driver or the operator from feeling uncomfortable about presentation of the remaining battery level.

The present disclosure has been described above based on the exemplary embodiment. It is to be understood by the person of ordinary skill in the art that the exemplary embodiment is an example, that combinations of its configuration elements and processing processes can have various modified examples, and that such modified examples are also within the scope of the present disclosure.

Figure 8:
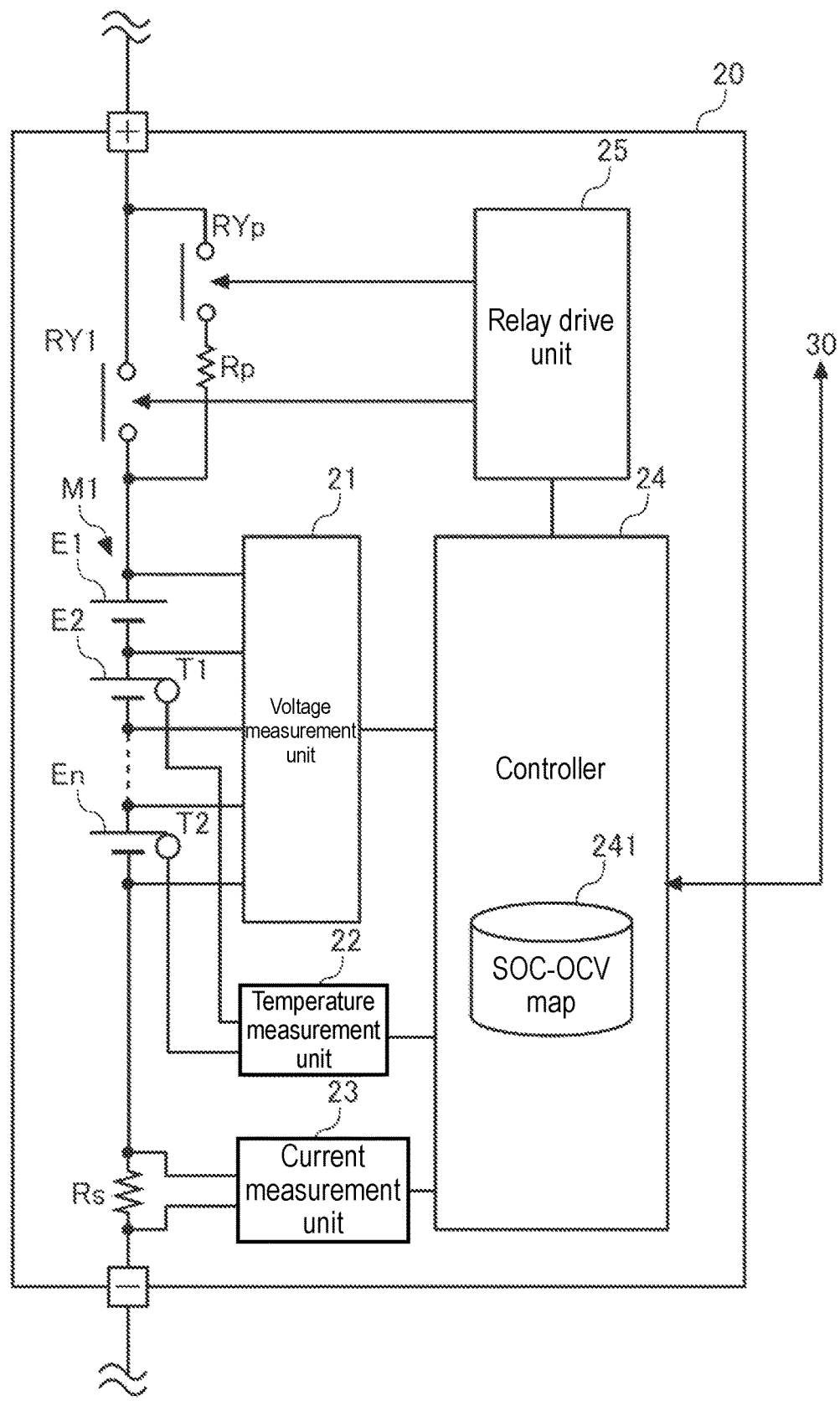
FIG. 8 is a view illustrating an internal configuration example of a battery pack according to a modified example.

FIG. 8 is a view illustrating an internal configuration example of battery pack 20 according to a modified example. In the modified example, precharge relay RYp and precharge resistor Rp are connected in parallel with pack relay RY1. In this configuration example, relay controller 312 controls pack relay RY1 to be in an off state and precharge relay RYp to be in an on state when the SOC difference between the plurality of battery packs 20 is out of a first predetermined range (for example, 15%) but is within a second predetermined range (for example, 30%) wider than the first predetermined range. In this state, since discharge or charge is performed via precharge resistor Rp, an inrush current is suppressed.

The second predetermined range depends on the resistance value of precharge resistor Rp. If the resistance value is set to be large, loss during discharging or charging increases, but the second predetermined range can be widened. When the SOC difference between the plurality of battery packs 20 reaches the first predetermined range, relay controller 312 turns off precharge relay RYp and turns on pack relay RY1. According to the modified example, it is possible to increase the number of simultaneously connectable battery packs 20 in parallel.

At least one of main relay RYm, charging relay RYc, pack relay RY1, and precharge relay RYp in the above-described exemplary embodiment may be replaced with another type of switch such as a semiconductor switch instead of the relay.

In the above-described exemplary embodiment, a configuration example in which the plurality of removable, portable, and exchangeable battery packs 20 are connected in parallel has been described. In this regard, application of the present disclosure to a configuration example in which a plurality of fixed battery packs 20 are connected in parallel is not excluded.

In the above-described exemplary embodiment, an example of using battery pack 20 incorporating battery module M1 including the lithium ion battery cell, the nickel metal hydride battery cell, the lead battery cell, or the like has been described. In this regard, a capacitor pack incorporating a capacitor module including an electric double layer capacitor cell and a lithium ion capacitor cell may be used. In the present description, a battery pack and a capacitor pack are collectively called a power storage pack.

The exemplary embodiment may be specified by the following items.

[Item 1]

Management device (30) that manages a plurality of power storage packs (20) connected in parallel to load (60) via respective switches (RY1), management device (30) including;
  acquisition unit (311) that acquires monitoring data including at least one of voltage and state of charge (SOC) of the plurality of power storage packs (20);
  switch controller (312) capable of individually controlling on/off of the plurality of switches (RY1) based on a voltage difference between the plurality of power storage packs (20) or an SOC difference between the plurality of power storage packs (20); and
  capacity calculator (313) that calculates an entire capacity of the plurality of power storage packs (20),
in which when calculating the entire capacity of the plurality of power storage packs (20), capacity calculator (313) also adds a capacity of power storage pack (20) connected to switch (RY1) in an off state in a case where switch (RY1) can be controlled to an on state in future.

According to this, it is possible to appropriately calculate the entire capacity of the plurality of power storage packs (20) connected in parallel to be notified to the user.

[Item 2]

Management device (30) according to Item 1, in which capacity calculator (313) calculates, as an actual capacity for notifying a user, an actual capacity obtained by adding an actual capacity of power storage pack (20) connected to switch (RY1) in an on state and an actual capacity of power storage pack (20) connected to switch (RY1) that can be controlled to an on state in future.

According to this, it is possible to appropriately calculate the entire actual capacity of the plurality of power storage packs (20) connected in parallel to be notified to the user.

[Item 3]

Management device (30) according to Item 1, in which capacity calculator (313) calculates, as an SOC for notifying a user, an SOC obtained by dividing, by a total of respective capacities, a total of products of respective SOCs and respective actual capacities of power storage pack (20) connected to switch (RY1) in an on state and power storage pack (20) connected to switch (RY1) that can be controlled to an on state in future.

According to this, it is possible to appropriately calculate the entire SOC of the plurality of power storage packs (20) connected in parallel to be notified to the user.

[Item 4]

Management device (30) according to any one of Items 1 to 3, in which capacity calculator (313) excludes the capacity of power storage pack (20) in which an abnormality has occurred when calculating the entire capacity of the plurality of power storage packs (20).

According to this, it is possible to appropriately calculate the entire capacity of the plurality of power storage packs (20) connected in parallel to be notified to the user.

[Item 5]

Management device (30) according to any one of Items 1 to 4, in which switch controller (312) controls, to be in an on state, a plurality of switches (RY1) of combinations that satisfy a minimum number of power storage packs (20) in parallel for securing power necessary for operating load (60) and in which a voltage difference between the plurality of power storage packs (20) or an SOC difference between the plurality of power storage packs (20) falls within a predetermined range.

According to this, it is possible to simultaneously discharge as many power storage packs (20) as possible or simultaneously charge as many power storage packs (20) as possible while suppressing cross current.

[Item 6]

Management device (30) according to any one of Items 1 to 5, in which each of the plurality of power storage packs (20) is removable, portable power storage pack (20).

According to this, it is possible to appropriately calculate the entire capacity of the plurality of portable power storage packs (20) from which the SOC or the SOH easily deviate.

[Item 7]

Power supply system (10) including: a plurality of removable, portable power storage packs (20) connected in parallel; and management device (30) according to any one of Items 1 to 6.

According to this, it is possible to construct power supply system (10) capable of appropriately calculating the entire capacity of the plurality of power storage packs (20) connected in parallel to be notified to the user.

[Item 8]

Electrically driven moving body (1) including: motor (60) as load (60); and power supply system (10) according to Item 7 that supplies power to motor (60).

According to this, it is possible to achieve electrically driven moving body (1) capable of appropriately calculating the entire capacity of the plurality of power storage packs (20) connected in parallel to be notified to the user.

[Item 9]

A management method for managing a plurality of power storage packs (20) connected in parallel to load (60) via respective switches (RY1), the management method including:
- acquiring at least one of voltage and SOC of the plurality of power storage packs (20);
- individually controlling on/off of the plurality of switches (RY1) based on a voltage difference between the plurality of power storage packs (20) or an SOC difference between the plurality of power storage packs (20);
- calculating the entire capacity of the plurality of power storage packs (20); and notifying a user of a calculated capacity,
- in which when calculating the entire capacity of the plurality of power storage packs (20), the calculating the capacity also adds a capacity of power storage pack (20) connected to switch (RY1) in an off state in a case where switch (RY1) can be controlled to an on state in future.

According to this, it is possible to appropriately calculate the entire capacity of the plurality of power storage packs (20) connected in parallel to be notified to the user.

REFERENCE MARKS IN THE DRAWINGS 1 electrically driven moving body
2 commercial power system
3 charger
4 charging cable
10 power supply system
20 battery pack
30 management unit
M1 battery module
E1-En cell
21 voltage measurement unit
22 temperature measurement unit
23 current measurement unit
24 controller
241 SOC-OCV map
25 relay drive unit
31 processor
311 acquisition unit
312 relay controller
313 capacity calculator
314 notification unit
32 storage unit
40 moving body controller
50 inverter
60 motor
70 instrument panel
RYm main relay
RYc charging relay
RY1 pack relay
Rs shunt resistor
RYp precharge relay
Rp precharge resistor
T1-T2 temperature sensor

The invention claimed is:

1. A management device that manages a plurality of power storage packs connected in parallel to a load via a plurality of switches respectively, the management device comprising:
an acquisition unit that acquires monitoring data including at least one of a voltage and a state of charge of each of the plurality of power storage packs;
a switch controller configured to individually control on and off of the plurality of switches based on a voltage difference between the plurality of power storage packs or a state of charge difference between the plurality of power storage packs;
a capacity calculator that calculates entire capacity of the plurality of power storage packs; and
a notification unit that notifies a user of the entire capacity, as actual capacity,
wherein when calculating the entire capacity of the plurality of power storage packs, the capacity calculator adds actual capacity of one or more on-state power storage packs each connected to a corresponding switch in an on state and also adds actual capacity of one or more off-state power storage packs each connected to a corresponding switch in an off state and currently not providing power in a case where the corresponding switch of each of the one or more of the one or more off-state power storage packs is enabled to be an on state in future.

2. The management device according to claim 1, wherein the capacity calculator calculates, as a state of charge for notifying a user, a state of charge obtained by dividing, by a total of respective actual capacity, a total of products of respective states of charge and respective actual capacity of the on-state power storage packs and the off-state power storage packs.

3. The management device according to claim 1, wherein the capacity calculator excludes capacity of a power storage pack in which an abnormality has occurred among the plurality of power storage packs when calculating the entire capacity of the plurality of power storage packs.

4. The management device according to claim 1, wherein the switch controller causes the plurality of switches to be in an on state, among the plurality of switches, of combinations that satisfy a minimum number of power storage packs in parallel for securing power necessary for operating the load and in which a voltage difference between the plurality of power storage packs or a state of charge difference between the plurality of power storage packs falls within a predetermined range.

5. The management device according to claim 1, wherein each of the plurality of power storage packs is a removable, portable power storage pack.

6. A power supply system comprising:
the management device according to claim 1; and
the plurality of power storage packs connected in parallel that are removable, portable.

7. An electrically driven moving body comprising:
a motor as the load; and
the power supply system according to claim 6 that supplies power to the motor.

8. The management device according to claim 1, wherein the capacity calculator excludes capacity of a power storage pack of which capacity exceeds a threshold among the plurality of power storage packs when calculating the entire capacity of the plurality of power storage packs.

9. A management method for managing a plurality of power storage packs connected in parallel to a load via switches respectively, the management method comprising:
- acquiring at least one of voltage or a state of charge of each of the plurality of power storage packs;
- individually control on and off of the plurality of switches based on a voltage difference between the plurality of power storage packs or a state of charge difference between the plurality of power storage packs;
- calculating entire capacity of the plurality of power storage packs; and
- notifying a user of the entire capacity calculated,
- wherein when calculating the entire capacity of the plurality of power storage packs, actual capacity of one or more on-state power storage packs each connected to a corresponding switch in an on state is added and actual capacity of one or more off-state power storage packs each connected to a corresponding switch in an off state and currently not providing power is also added in a case where the corresponding switch of each of the one or more of the one or more off-state power storage packs is enabled to be an on state in future.

* * * * *